United States Patent [19]

Gaske et al.

[11] 4,127,460

[45] Nov. 28, 1978

[54] RADIATION-CURING AQUEOUS COATINGS PROVIDING A NONADHERENT SURFACE

[75] Inventors: Joseph E. Gaske, Mt. Prospect; Eugene S. Packer, Chicago; George J. England, Hillside, all of Ill.

[73] Assignee: DeSoto, Inc., Des Plaines, Ill.

[21] Appl. No.: 735,970

[22] Filed: Oct. 27, 1976

[51] Int. Cl.$^2$ .............................................. C08F 2/50
[52] U.S. Cl. ........................... 204/159.13; 204/159.16; 204/159.18; 204/159.23; 260/29.2 M; 260/29.1 SB; 260/29.6 NR
[58] Field of Search ................ 260/29.2 M, 29.6 NR, 260/29.1 SB; 204/159.13, 159.16, 159.18, 159.23

[56] References Cited

U.S. PATENT DOCUMENTS

| | | | |
|---|---|---|---|
| 3,320,197 | 5/1967 | Enders et al. | 260/29.2 M |
| 3,669,702 | 6/1972 | Roll et al. | 260/29.2 M |
| 3,844,916 | 10/1974 | Gaske | 260/837 R |
| 4,016,333 | 4/1977 | Gaske et al. | 260/29.1 SB |

Primary Examiner—Eugene C. Rzucidlo
Attorney, Agent, or Firm—Dressler, Goldsmith, Clement, Gordon & Shore, Ltd.

[57] ABSTRACT

A radiation-curable aqueous emulsion coating composition which cures to provide a nonadherent surface is provided by emulsifying droplets of liquid alkyl hydrogen polysiloxane in water, the water having dispersed therein a radiation-curable polyethylenically unsaturated tertiary amine, such as an amine polyacrylate, at least partially neutralized with a solubilizing acid. The aqueous emulsion preferably includes a photosensitizer rendering the composition curable with ultraviolet light.

10 Claims, No Drawings

RADIATION-CURING AQUEOUS COATINGS PROVIDING A NONADHERENT SURFACE

The present invention relates to radiation curable aqueous coatings which cure to provide a nonadherent surface. Ultraviolet radiation is particularly contemplated.

Release coatings are themselves well known and in common use. The objective is to provide coatings with a nonadherent surface which easily releases a material having a strongly adherent surface (termed an aggressive adhesive) without damaging the adhesive character of the surface which is released. This requires that the release coating be adequately cured with the agent which provides the nonadherent surface, so as to prevent it from transferring to the adhesive surface where it would impair the adhesive characteristics.

This invention is concerned with the provision of aqueous coating systems which can be deposited and radiation-cured to provide the desired transfer-resistant release coating.

It is first desired to point out that radiation curable coatings having nonadherent surfaces are disclosed in the prior application of Joseph E. Gaske and Nick T. Georgas, Ser. No. 518,004, filed Oct. 25, 1974. In that application, there is used nonaqueous emulsions of a liquid alkyl hydrogen polysiloxane in a radiation polymerizable polyethylenically unsaturated liquid. This invention, unlike the above noted previous effort, contemplates aqueous systems.

In accordance with this invention, a small proportion of a liquid alkyl hydrogen polysiloxane is emulsified in an aqueous medium having dispersed therein a polyethylenically unsaturated material containing tertiary amine groups, dispersion being achieved with the aid of a solubilizing acid. The polysiloxane is not directly miscible with water, and it is used herein in the form of emulsified droplets which are maintained in stable emulsion by means of an appropriate emulsifying agent. The resulting aqueous emulsion will further include appropriate photosensitizers, when ultraviolet cure is intended.

This aqueous emulsion is then applied to a substrate, typically paper, and the deposited material is exposed to radiation, normally ultraviolet radiation, to provide a cured coating having a nonadherent surface which resists transfer to an adhesive surface in contact therewith. The ultraviolet cure is not air-inhibited, and organic solvents are not needed. Indeed, the absence of volatilizable components other than water is a feature of the invention. Another feature of the invention is that reactive diluents are not needed to thin the coating composition to coating viscosity, and this minimizes absorption of the deposited coating into an absorptive substrate, such as paper.

More particularly, it has been found that when radiation-curable polyethylenically unsaturated tertiary amines are dispersed in water with the aid of a solubilizing acid, and when the water immiscible liquid alkyl hydrogen polysiloxanes are emulsified into the same aqueous phase, the siloxane and the polyethylenically unsaturated compound can be intimately codeposited from the aqueous medium. The water evaporates, either with or without the aid of mild heat, and the resulting codeposit of polysiloxane and polyethylenically unsaturated amine will radiation-cure as described in the previously noted application of Gaske and Georgas to provide the desired nonadherent surface.

Using the preferred liquid polyacrylate-based tertiary amines, low viscosity milky emulsions are obtained which can be applied as a film over calendered paper and cured by the ultraviolet and heat energy emitted from 200 watt/inch mercury arc lamps focused on the paper. This forms a dry, very adherent, and solvent-resisting coating while operating in an air atmosphere. The surface of this coating is not smeary or oily, indicating reaction of the alkyl hydrogen polysiloxane. It is not wetted by hexane, water, or methanol, indicating low surface energy. Cellophane-backed pressure sensitive tape does not adhere to the coating. The use of water reduces the viscosity of the base composition, facilitating application of thin films.

Many polyethylenically unsaturated liquids which polymerize on exposure to radiation are known, and the alkyl hydrogen polysiloxane can be cured with any of these in accordance with the invention, so long as the polyethylenic liquid includes a tertiary amine group to enable dispersion in water with the aid of a solubilizing acid. Polyacrylates are particularly preferred since they enable rapid cure on ultraviolet exposure, and also because they respond well to ionizing radiation. While various types of ionizing or actinic radiation are known for the radiation-cure of polyethylenic liquids, such as beta radiation or electron beam radiation, these are less convenient or more expensive, and the preference for ultraviolet radiation will be readily appreciated by the art, especially since the contemplated coatings are usually lacking in ultraviolet absorptive pigments. Also, the mild heat supplied by the ultraviolet lamp helps to drive off the water.

Many liquid polyacrylates are available, these normally being the reaction product of at least two mols of acrylic acid with one mol of a polyhydric alcohol, both direct and transesterification being available as production methods. The polyhydric alcohol may be fully or partially acrylated, and both types of products are useful herein. Polyacrylates containing from 2-4 acrylate groups per molecule are preferred, such as trimethylol propane triacrylate. Many other polyacrylates are fully useful herein, such as butylene glycol diacrylate, trimethyol propane diacrylate, glyceryl triacrylate, pentaerythritol ditri- or tetraacrylate, sorbitol tetraacrylate, epoxy polyacrylates, such as a bisphenol-based diglycidyl ether having a molecular weight of 350-1000 reacted with acrylic acid to incorporate from 3-4 acrylate groups per molecule, and similar polyacrylates. As will be apparent, the radiation polymerizable ethylenic groups provide the desired cure, but other reactive groups which do not induce excessive instability may be present, the hydroxy groups being one such group as noted above.

It is preferred to employ liquid polyacrylate tertiary amines of high viscosity, desirably a viscosity of at least about 200 centipoises. This somewhat further reduces the absorption of the codeposit into absorptive substrates, such as paper. The use of high viscosity liquid polyacrylate tertiary amines to form aqueous emulsions in an aqueous continuum is the subject of the application of Leslie Gatechair, Ser. No. 629,558, filed Nov. 6, 1975, and these emulsions are useful herein. It is also desired to be able to rely upon materials of lower volatility so as to reduce the toxicity of the materials which are handled. The nonadherent surface characteristic is provided using a liquid alkyl hydrogen polysiloxane.

These are known compounds. Any liquid alkyl hydrogen polysiloxane may be used herein.

The term "siloxane" is a conventional one, defining the structure:

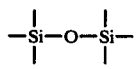

which may recur to provide the desired molecular weight which may vary considerably so long as the product is a liquid at room temperature.

The siloxanes which are preferably used in this invention are substituted only with alkyl groups and hydrogen groups, and have the structure:

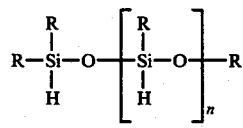

where $n$ is a number of from 1–100, but is preferably in the range of 4–30, and R is an alkyl group preferably containing from 1–4 carbon atoms, and is most preferably a methyl group. The structural formula is not intended to restrict the ratio of alkyl groups to hydrogen groups, which can vary.

More particularly, the ratio of alkyl groups to hydrogen groups in the above structure may vary from 1:10 to 10:1, but is preferably in the range of 1:2 to 2:1. A fluid having the above structure in which the ratio of methyl groups to hydrogen groups is about 1:1 and in which $n$ is about 15 (providing a molecular weight of about 1000) is particularly preferred, and will be used herein as an illustration (identified as methyl hydrogen polysiloxane "A"). The described material has a specific gravity at 25° C. of 1.0 gm. per cc. and a viscosity at 25° C. of 30 centistokes. A product of this general description which may be utilized herein is available from Dow Corning under the description DC 1107.

The liquid alkyl hydrogen polysiloxane is codeposited with the emulsified polyethylenic tertiary amine and it is preferred to maintain the polysiloxane in emulsion using a silicone oil-based emulsifying agent, though this is not essential since any emulsifying agent is broadly useful. Silicone surfactants, such as the General Electric Silicone oil SF-1066, provide desired emulsion stability in the deposited coatings, and minimize phase separation. General Electric Silicone surfactant PFA-1635 which is a polyoxyalkylene silicone oil is also useful. Dow Corning also has available appropriate emulsifiers, these being polymethylsiloxanepolyoxyethylene copolymers sold as 470A, 471A, 472, 473, and 474A. These products are silicone oils which have been reacted with ethylene oxide to provide a hydrophilic side chain providing emulsifier characteristics.

Other emulsifying agents such as nonionic surfactants such as ethylene oxide adducts of octyl or vinyl phenols containing 6–60 mols of ethylene oxide per mol of said phenol may be used, such as the Rohm & Haas product Triton X-405. Emulsifying agent is not essential since one can agitate the emulsion as it is applied.

The proportion of the liquid alkyl hydrogen polysiloxane with respect to total resin solids in the emulsion can vary from about 2 to about 50 weight percent, it being preferred to use from about 4 to about 30 percent.

Application of the emulsion to paper can employ any convenient coating technique, such as roll coating, gravure, brushing, etc., and only a brief exposure to ultraviolet light is required for cure, as will be illustrated hereinafter.

As previously indicated it is desired to minimize absorption into the substrate of the polyethylenic tertiary amine or any ethylenically unsaturated diluent which is dispersed in the water phase, and this is achieved by having the polyethylenic amine in a viscous form so its dispersal in water with the aid of an acid directly produces an emulsion. Thus, in the preferred practice of this invention, two emulsions are combined.

The polyethylenically unsaturated amines are dispersed in water with the aid of solubilizing acid to provide an emulsion containing viscous droplets of at least partially neutralized tertiary amine. This emulsion preferably has a resin solids content of at least 40% by weight and a pH of from 0.5–8.5, preferably 6.0 to 7.0, though this is not essential. An ultraviolet photosensitizer is preferably incorporated in the emulsion (preferably into the oil phase thereof) and the emulsion is applied as a coating and a film is formed by coalescence of the emulsion particles. This film, when it contains the photosensitizer, is curable upon ultraviolet exposure. Water can be evaporated from the film either prior to the ultraviolet exposure or the mild heat of the ultraviolet lamp can serve this same purpose.

The unsaturated amines which are used herein can be formed in various ways. It is preferred to react an organic compound containing one or more ethylenic side chains, preferably a polyacrylate, with a small proportion of aliphatic amine containing from one to a maximum of three amino hydrogen atoms, preferably a monosecondary amine, to produce an ethylenically unsaturated tertiary amine adduct by Michael addition, this tertiary amine retaining much of the original unsaturation. This unsaturated tertiary amine is then reacted with a solubilizing acid to protonate the same and enable it to be emulsified in water. Based on each mole of ethylenically unsaturated organic compound which is modified, at least about 0.05 equivalent of amine should be used. The maximum proportion of amine is determined by that amount which leaves less than about one equivalent of ethylenic unsaturation per mol of the radiation curable material. Usually, one will use from 0.2–1.2 equivalents of amine per mole of ethylenically unsaturated organic compound. The existence of an emulsion is documented by the low viscosity which is obtained, and also by the turbidity or milky appearance which is produced.

While polyacrylates are preferred, as noted above, any ethylenically unsaturated group can be used which will adduct with amino hydrogen, such as the methacrylate or crotonate group. Also, while acrylates esters are preferred, ethers are also useful, such as polynorbornene ethers of polyhydric alcohols, such as glycerin, trimethylol propane, and pentaerythritol.

The choice of amines with which to form the unsaturated amines is subject to considerable variation, but aliphatic amines are preferred since these have the highest reactivity with the ethylenic groups in the polyethylenic compound. The amine should have from 1 to 2 amino hydrogen atoms per molecule, but the preferred amine functionality is 1 in order to minimize the molecular weight of the tertiary amine Michael adduct.

Monosecondary amines are available, and are particularly preferred. The choice of a monosecondary amine is particularly important where the polyethylenically unsaturated compound is of relatively high molecular weight, as in epoxy polyacrylates, or where hydroxy functional polyacrylates are reacted with diisocyanates to increase molecular weight without reducing the ethylenic functionality.

The preferred monosecondary amines are illustrated by diethyl amine and dibutyl amine, diethyl amine being best in this invention. Dioctyl amine and diallyl amine are also useful. Hydroxy functional amines, such as diethanol amine, are useful, but less preferred, because the hydroxy groups contribute to instability. Ethyl amine and butyl amine will illustrate higher functional amines which are useful, especially in admixture with the preferred monosecondary amines where they function to provide a controlled increase in viscosity.

From the standpoint of the viscosity of the polyethlenically unsaturated tertiary amines which are preferably resinous in this invention, the preferred resins, after solubilization with the solubilizing acid, have a viscosity of at least 500 centipoise, preferably in the range of 6–50 poise.

The reaction between the amine and the ethylenic unsaturation is a known reaction, being easily forced to completion by moderate heat as taught in United States Patent 3,844,916.

The specific nature of the solubilizing acid used to disperse the polyethylenically unsaturated amine in water is of secondary significance. Inorganic acids, such as hydrochloric acid or sulfuric acid, are useful, though not preferred. It is presently preferred to employ phosphoric acid, glycolic acid (hydroxy acetic acid), or acetic acid, but other acids can be used, such as formic acid. Propionic acid is also useful.

The solubilizing acid is used in an amount to provide a dispersion or an oil-in-water emulsion having a preferred pH in the range of pH 6.0–7.0.

The class of ultraviolet photosensitizers is well known, and it is illustrated in said United States Patent 3,844,916. It will be illustrated herein using benzophenone, but benzoin ethers, especially the $C_1$–$C_4$ alkyl ethers thereof, are also useful.

Organic solvent is not normally needed in this invention, but it is possible to use a small proportion of solvent for various purposes, but most importantly to permit the use of polyacrylates of such high molecular weight that they are insufficiently liquid for emulsification. The selection of solvent will vary with the intended purpose, but xylene or octyl alcohol will illustrate water immiscible solvents which can aid emulsification. 2-ethoxy ethanol acetate in small amount will illustrate a solvent which can aid particle coalescence during film formation.

The invention will be illustrated in the example which follows, it being understood that all proportions used herein are by weight unless otherwise stated.

EXAMPLE 1

| parts | |
|---|---|
| 10 | pentaerythritol tetraacrylate Michael adducted with 6% of diethyl amine |
| 0.5 | benzophenone |
| | The above are mixed and the mixture is warmed with stirring until the blend is homogeneous |
| 0.5 | acetic acid (glacial) |
| | Add with stirring |

-continued

| parts | |
|---|---|
| 10 | water |
| | Stir to produce a uniform milk-appearing fluid |
| 3 | methyl hydrogen polysiloxane A containing 0.1 part of emulsifying agent. General Electric product SF1066 is an appropriate emulsifying agent. |

Stir to provide a uniform milky-appearing fluid

The above emulsion is applied to supercalendered paper with a #3 wire wound rod. The coating cures by passing it under three 200 watt/inch mercury lamps using a single pass beneath the lamps at a speed of 100 feet per minute. The product is matte finished release coated paper.

It is desired to point out that the invention provides a curious result from the standpoint of the coating of super calendered paper because these coated papers already possess a reasonably repellent surface and we wish the coatings of this invention to simultaneously carry out three apparently inconsistent functions as follows. First, the solid material of the coating must exhibit minimal penetration into the body of the paper. This minimizes physical adhesion to the substrate. Second, the applied coating must cure to provide a surface which is even more nonadherent than the original calendered surface. Third, the cured coating must adhere tenaciously to the calendered substrate. These disparate functions are all achieved using the aqueous coatings of this invention.

It is also noted that the aqueous coatings of this invention can be used to serve diverse purposes, such as a seal coat, a high topcoat or a matt finish overprint coating.

Repeating Example 1 but using 1 part of methyl hydrogen polysiloxane A provides a less costly and still servicible product. The achievement of good release properties with the bulk of the release coating being constituted by nonsilicone-containing material is an important feature of this invention.

EXAMPLE 2

| parts by weight | |
|---|---|
| 90.3 | pentaerythritol triacrylate (average 3.3 acrylate groups per molecule) adducted with 7% by weight of diethyl amine |
| 3 | benzophenone |
| 3 | triethylene glycol diacrylate |
| 3.6 | glacial acetic acid |
| 0.1 | GE SF 1066 emulsifier. |

Heat to about 30° C. to complete salt formation and dispersion. Add 25 parts of (Dow Corning 1107) methyl hydrogen polysiloxane A and mix to provide a cloudy emulsion. Then add 68.34 parts of distilled water and mix to provide the following properties. viscosity = 540 centipoise measured with a No. 6 spindle in a Brookfield viscometer at 10 RPM at 25° C.

Apply to calendered paper as in Example 1 and cure under four 200 watt/inch mercury lamps at a speed of 150 feet per minute. In comparison with Example 1 the flow out of the coating on the paper substrate was somewhat improved.

The invention is defined in the claims which follow. We claim:

1. An ultraviolet-curable aqueous emulsion coating composition which cures to provide a nonadherent surface comprising water having emulsified therein from about 2 to about 50 weight percent, based on total resin solids, of droplets of liquid alkyl hydrogen polysiloxane having the formula:

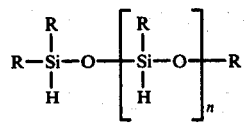

where $n$ is a number from 4–30, R is an alkyl group containing from 1 to 4 carbon atoms, and the ratio of alkyl groups to hydrogen groups is from 1:2 to 2:1, said water having emulsified therein a liquid polyacrylate tertiary amine having a viscosity of at least 200 centipoises reacted with a solubilizing acid to produce a quaternary ammonium salt which disperses in water in the form of an emulsion having a pH in the range of 5.0–8.5, said aqueous emulsion including a photosensitizer rendering said composition curable with ultraviolet light.

2. An aqueous emulsion coating composition as recited in claim 1 in which said polysiloxane is a methyl hydrogen polysiloxane present in an amount of 4–30 weight percent, said polyacrylate tertiary amine is the reaction products of a polyacrylate containing from 2–4 acrylate groups per molecule with from 0.2–1.2 equivalents of amine per mole of polyacrylate.

3. An aqueous emulsion coating composition as recited in claim 2 in which a ketonic photosensitizer is used and said emulsion is free of volatilizable components other than water.

4. An aqueous emulsion coating composition as recited in claim 1 in which said emulsion is free of volatilizable components other than water.

5. An aqueous emulsion coating composition as recited in claim 1 in which said polysiloxane is a methyl hydrogen polysiloxane.

6. An aqueous emulsion coating composition as recited in claim 1 in which said polyethylenically unsaturated tertiary amine is a liquid polyacrylate containing from 2–4 acrylate groups per molecule reacted with at least 0.05 equivalent of amine per mole of polyacrylate, and said liquid alkyl hydrogen polysiloxane is present in an amount of from about 4 to about 30 weight percent based on total resin solids.

7. An aqueous emulsion coating composition as recited claim 6 in which said polyacrylate is reacted with from 0.2–1.2 equivalents of amine per mole of polyacrylate.

8. An aqueous emulsion coating composition as recited in claim 1 in which said polyethylenically unsaturated tertiary amine, after solubilization with said solubilizing acid, has a viscosity of at least 500 centipoises.

9. An aqueous emulsion coating composition as recited in claim 8 in which said viscosity is in the range of 6–50 poise.

10. An ultraviolet-curable aqueous emulsion coating composition which cures to provide a nonadherent surface comprising water having emulsified therein from 4–30 weight percent, based on total resin solids, of droplets of liquid alkyl hydrogen polysiloxane having the formula:

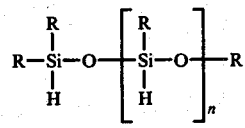

where n is a number from 4–30, R is an alkyl group containing from 1 to 4 carbon atoms, and the ratio of alkyl groups to hydrogen groups is from 1:2 to 2:1, said water having emulsified therein a liquid polyacrylate tertiary amine which is the reaction product of a polyacrylate containing from 2–4 acrylate groups per molecule with from 0.2–1.2 equivalents of amine per mole of polyacrylate, said polyacrylate tertiary amine having a viscosity in the range of 6–50 poise and being reacted with a solubilizing acid to produce a quaternary ammonium salt which disperses in water in the form of an emulsion, said aqueous emulsion including a photosensitizer rendering said composition curable with ultraviolet light.

* * * * *